(12) United States Patent
Hayashi et al.

(10) Patent No.: US 8,810,287 B2
(45) Date of Patent: Aug. 19, 2014

(54) DRIVER FOR SEMICONDUCTOR SWITCH ELEMENT

(75) Inventors: Masanori Hayashi, Osaka (JP); Yoshiaki Honda, Kyoto (JP); Kiyoshi Gotou, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/976,128

(22) PCT Filed: Jan. 12, 2012

(86) PCT No.: PCT/JP2012/050414
§ 371 (c)(1),
(2), (4) Date: Jun. 26, 2013

(87) PCT Pub. No.: WO2012/096321
PCT Pub. Date: Jul. 19, 2012

(65) Prior Publication Data
US 2013/0271187 A1 Oct. 17, 2013

(30) Foreign Application Priority Data

Jan. 14, 2011 (JP) ................................. 2011-006284

(51) Int. Cl.
| | | |
|---|---|---|
| *H03K 3/00* | (2006.01) | |
| *H03K 17/06* | (2006.01) | |
| *H03K 17/16* | (2006.01) | |
| *H03K 17/687* | (2006.01) | |
| *H02M 3/335* | (2006.01) | |
| *H03K 17/691* | (2006.01) | |

(52) U.S. Cl.
CPC .............. *H03K 17/16* (2013.01); *H03K 17/063* (2013.01); *H03K 2017/066* (2013.01); *H03K 2017/6878* (2013.01); *H02M 3/335* (2013.01); *H03K 2217/0081* (2013.01); *H03K 17/691* (2013.01)
USPC ........................................................ 327/109

(58) Field of Classification Search
USPC ........................................................ 327/109
See application file for complete search history.

(56) References Cited

U.S. PATENT DOCUMENTS 7,514,908 B2 * 4/2009 Hosokawa et al. ........... 323/222

FOREIGN PATENT DOCUMENTS

| JP | 07-015949 A | 1/1995 |
|---|---|---|
| JP | 2638625 B2 | 4/1997 |
| JP | 2003-069406 A | 3/2003 |

OTHER PUBLICATIONS

International Search Report for corresponding International Application No. PCT/JP2012/050414 mailed Apr. 10, 2012.
Form PCT/ISA/237 for corresponding International Application No. PCT/JP2012/050414 dated Apr. 10, 2012.

* cited by examiner

*Primary Examiner* — Daniel Rojas
(74) *Attorney, Agent, or Firm* — Renner, Otto, Boisselle & Sklar, LLP

(57) ABSTRACT

A driver includes a converter section 2 which includes a switching element Q1 and which is configured to output a desired DC voltage by switching the switching element Q1, a control section 1 configured to control the switching operation of the switching element Q1, capacitors C1A, C1B charged by the output of the converter section 2, turn-on circuits 31A, 31B configured to supply gates of a bidirectional switch element 4 using electric charges stored in the capacitors C1A, C1B with drive powers to turn-on the bidirectional switch element 4, and turn-off circuits 32A, 32B configured to discharge the capacitors C1A, C1B to turn-off the bidirectional switch element 4 in response to the halt of the switching operation of the switching element Q1 by the control section 1.

17 Claims, 15 Drawing Sheets

FIG. 6
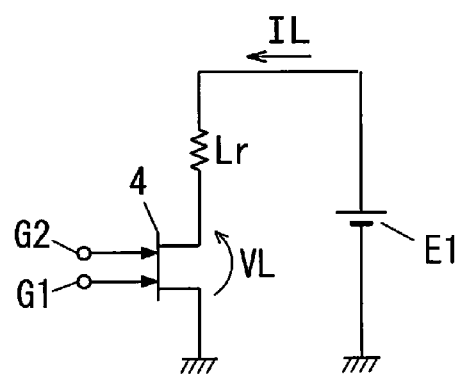
FIG. 7A X1
FIG. 7B Vg1, Vg2  -- Vs1
FIG. 7C Vg21 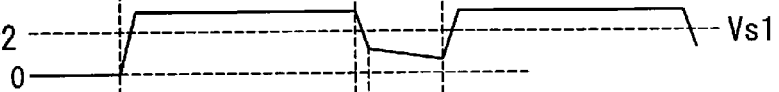
FIG. 7D Driving State of Q21 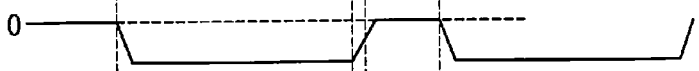

FIG. 8
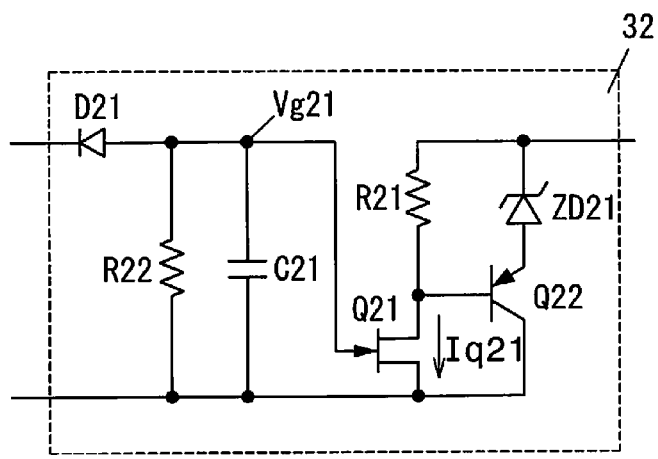
FIG. 9A  X1
FIG. 9B  Vg21
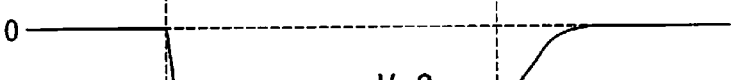
FIG. 9C  Iq21
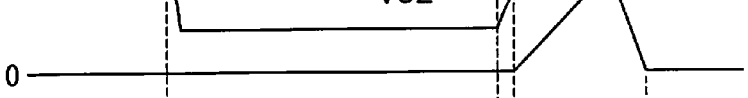
FIG. 9D  Vg1, Vg2

FIG. 12A  X1 
FIG. 12B  Vg21 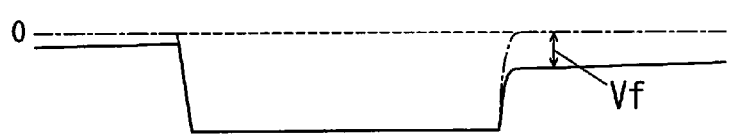
FIG. 12C  Iq21 
FIG. 12D  Vg1, Vg2 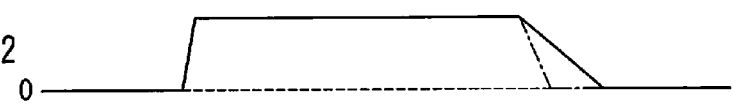
FIG. 13
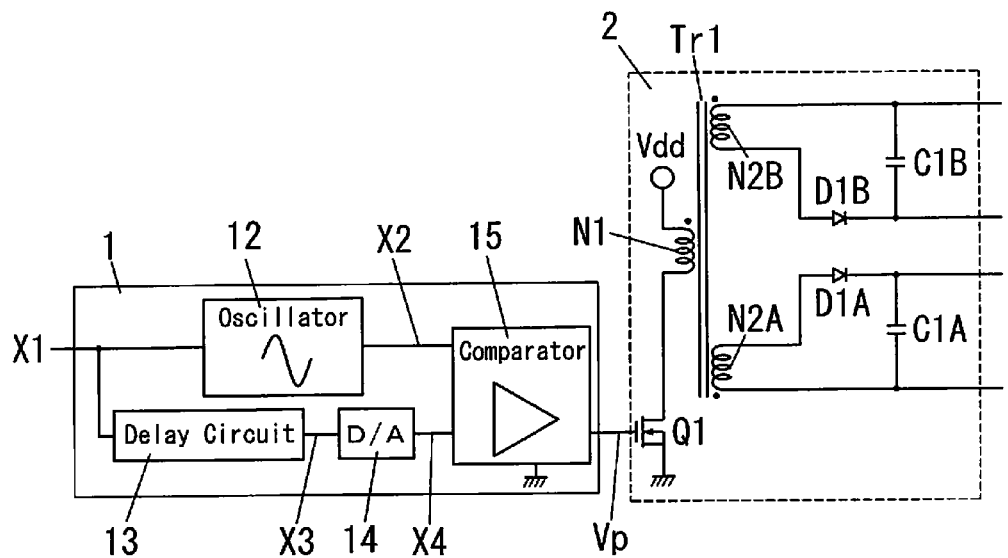

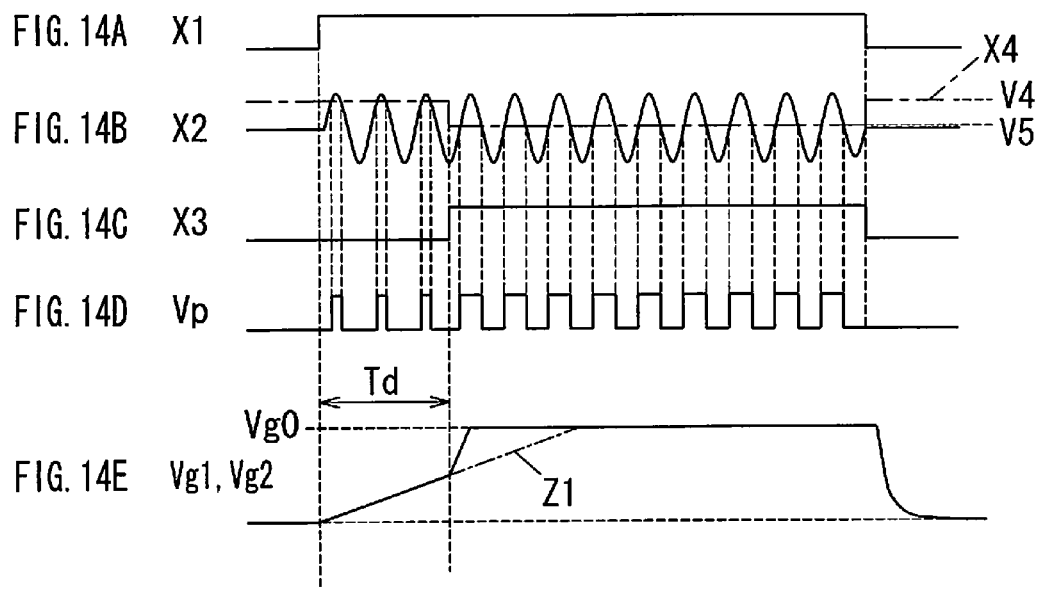
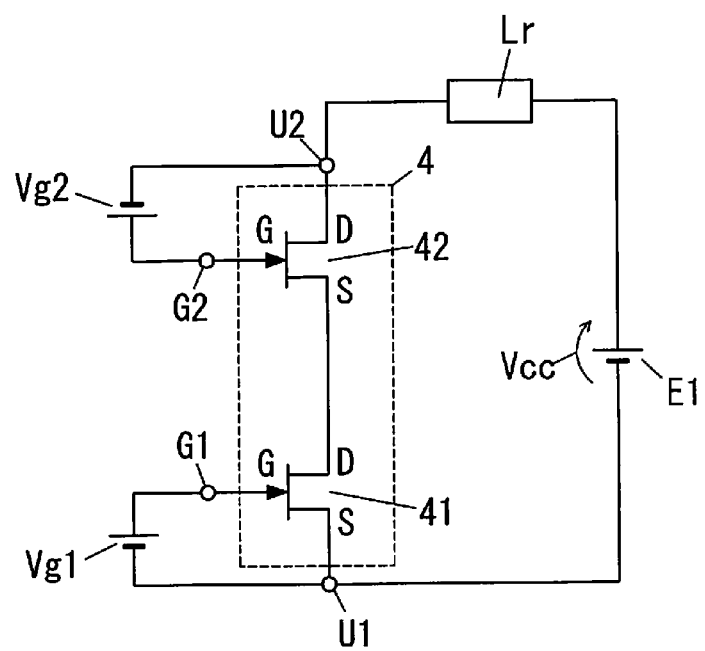
FIG. 15

DRIVER FOR SEMICONDUCTOR SWITCH ELEMENT

TECHNICAL FIELD

The invention relates to a driver for semiconductor switch element.

BACKGROUND ART

There has been known a semiconductor switch element used as a switching element adapted in use for switching ON and OFF a power supply. Examples of the semiconductor switch elements include such as MOSFET (Metal Oxide Semiconductor Field Effect Transistor) and IGBT (Insulated Gate Bipolar Transistor).

As a driver for driving the MOSFET or IGBT, there has been proposed to use an insulated type DC-DC converter with a transformer.

For example, JP2003-69406A discloses an example of a driver for semiconductor switch element (see FIG. 17). In JP2003-69406A, a high voltage semiconductor switch is realized by a plurality of switching elements Q101 connected in series with each other, where each of the switching elements Q101 is constituted by IGBT. In the configuration of JP2003-69406A, diodes D101 are provided in inverse-parallel connections with the respective switching elements Q101.

In the light of maintaining the DC (direct-current) voltage balance, each of the switching elements Q101 is connected to a corresponding parallel resistor R101. In the light of maintaining the voltage balance when the switch element is turned-off, each of the switching elements Q101 is connected to a corresponding snubber circuit constituted by a diode D103, a resistor R102, and a capacitor C101.

In this configuration, each of the switching elements Q101 is driven by a secondary winding N102 of a corresponding pulse transformer Tr101, where primary windings N101 of the pulse transformers Tr101 are connected in series with each other. With respect to each switching element Q101, a full-wave bridge rectifier DB101, a smoothing capacitor C102, a resistor R103, a diode D102, and a PNP transistor Q102 are connected between the secondary winding N102 of the pulse transformer Tr101 and a gate of the switching element Q101.

In addition, a two-terminal trigger device K101 and a series resistor R104 are connected between the bridge rectifier DB101 and the switching element Q101. A collector of the switching element Q101 is connected to a resonator circuit 101. When an electric voltage larger than a predetermined voltage is applied on the collector of the switching element Q101, the two-terminal trigger device K101 is applied with a breakdown voltage and becomes conductive, and thereby an electric voltage is applied on the gate of the switching element Q101.

In this configuration, the primary windings N101 of the pulse transformers Tr101 are connected in series with a secondary winding N202 of a push-pull transformer Tr102. A push-pull inverter is realized by: a DC control source E101; a primary winding N201 with a center-tap of the push-pull transformer Tr102; and two switching elements Q103, Q104 each of which is formed of a FET and which are controlled to be turned on alternately. A high-frequency pulse generator 102 is constituted by a pulse generator that generates signals with opposite phases so as to alternately turn on the switching devices Q103, Q104.

For the purpose of improving the voltage tightness and reducing an on-resistance of a switching element, there has been studied such a switching element that is formed of a wide-gap semiconductor having a large bandgap. Examples of the wide-gap semiconductors include such as SiC (silicon carbide) and GaN (gallium nitride). For example, the wide-gap semiconductor is defined as a semiconductor having a bandgap twice or more of a bandgap (1.1 [eV]) of silicon (Si) (i.e. semiconductor having a bandgap more than 2.2 [eV]).

As a semiconductor switch FET (Field-Effect Transistor) formed of GaN (which is a kind of wide-gap semiconductor), it has been reported such a FET that has a p-n junction or a schottky junction at its gate and that has a normally-off property. Such a junction-gate type FET has a diode structure in a region between the gate and the source, and an application of an electric voltage induces a gate current. Therefore, in case where the FET is driven by the conventional driver having the circuit configuration shown in FIG. 17, there is a possibility that the diode D102 cannot reach an inversely-biased state and the FET cannot turn-off in a desired speed, due to the gate current.

DISCLOSURE OF THE INVENTION

The present invention is developed in view of above problem, and it is an object of the invention to provide a driver that can drive and turn-off a semiconductor switch element which requires a gate current (driving current).

A driver for semiconductor switch element of the invention includes: a converter section that includes a first switching element and that is configured to output a desired direct-current voltage by switching the first switching element; a control section configured to control the switching operation of the first switching element; a first capacitor configured to be charged by an output of the converter section; a turn-on circuit configured to supply a control terminal of the semiconductor switch element with a drive power by use of an electric charge stored in the first capacitor to turn-on the semiconductor switch element; and a turn-off circuit configured to discharge the first capacitor to turn-off the semiconductor switch element in response to the halt of the switching operation of the first switching element by the control section.

In this invention, it is preferred that the turn-on circuit includes a constant current circuit configured to output a constant current.

In this invention, it is preferred that the turn-on circuit further includes a noise-reduction circuit for reducing the noise in the turn-on period, and the noise-reduction circuit is configured to increase an input impedance of the control terminal of the semiconductor switch element when the semiconductor switch element is turned-on.

In this invention, it is preferred that the noise-reduction circuit is configured to change the input impedance of the control terminal of the semiconductor switch element in response to the change of the voltage applied on the control terminal.

In this invention, it is preferred that the noise-reduction circuit is configured to decrease the input impedance of the control terminal at a predetermined time after start of the supply of the drive power to the control terminal of the semiconductor switch element.

In this invention, it is preferred that the semiconductor switch element includes a pair of transistors each of which has a control terminal, the transistors being connected in series to be capable of being conductive in both directions, the noise-reduction circuit includes a pair of noise-reduction circuits, and each of the noise-reduction circuits is connected to a control terminal of a corresponding transistor.

In this invention, it is preferred that the constant current circuit has a positive temperature coefficient.

In this invention, it is preferred that the constant current circuit includes a zener diode and a transistor, and the positive temperature coefficient of the constant current circuit is constituted by the difference in temperature coefficients between the zener diode and the transistor.

In this invention, it is preferred that the turn-on circuit includes a current limiting circuit that limits an electric current supplied to the control terminal of the semiconductor switch element to less than a predetermined current.

In this invention, it is preferred that the first capacitor as a forward capacitor is connected in parallel with output terminals of the converter section, the turn-on circuit includes a backward capacitor, the forward capacitor is connected closer to the output terminals than the backward capacitor is, the turn-on circuit includes a switch section configured to be turned off when the voltage across the forward capacitor is less than a predetermined voltage and to be turned on when the voltage across the forward capacitor is the predetermined voltage or more, and the backward capacitor is connected in parallel with the forward capacitor via the switch section.

In this invention, it is preferred that the control section is configured to change a duty ratio of the first switching element during the turn-on period of the semiconductor switch element, thereby increasing the drive voltage applied on the control terminal of the semiconductor switch element after changing the duty ratio.

In this invention, it is preferred that the turn-off circuit includes a second switching element connected in parallel with the first capacitor, and the turn-off circuit is configured to turn on the second switching element to discharge the first capacitor thereby turning-off the semiconductor switch element, and then to turn off the second switching element upon the voltage across the first capacitor decreasing to a predetermined voltage.

In this invention, it is preferred that the second switching element is connected in series with a zener diode, and the first capacitor is connected in parallel with a series circuit of the zener diode and the second switching element.

In this invention, it is preferred that the turn-off circuit includes: a parallel circuit of a second capacitor and a resistor, connected between output terminals of the converter section; and a depletion-type third switching element configured to be driven by a voltage across the parallel circuit, and the turn-off circuit is configured that a discharge current of the first capacitor increases with decrease of an on-resistance of the third switching element.

In this invention, it is preferred that the resistor is connected in series with a diode, and the second capacitor is connected in parallel with a series circuit of the resistor and the diode.

In this invention, it is preferred that the semiconductor switch element is formed of a wide-gap semiconductor.

In this invention, it is preferred that the semiconductor switch element includes a pair of transistors each of which has a control terminal, the transistors being connected in series to be capable of being conductive in both directions, and the driver includes a pair of driver sections, each of the driver sections including the first capacitor, the turn-on circuit, and the turn-off circuits, to be adapted to a corresponding transistor.

The present invention can drive and turn-off a semiconductor switch element which requires a gate current.

BRIEF DESCRIPTION OF DRAWINGS

FIG. 6 is a circuit diagram illustrating a load and the driver of the first embodiment;

FIGS. 7A to 7D are wave form charts for explaining the behavior of a turn-off circuit shown in FIG. 4;

FIG. 8 is a circuit diagram illustrating another turn-off circuit according to the first embodiment;

FIGS. 9A to 9D are wave form charts for explaining the behavior of the turn-off circuit shown in FIG. 8;

FIGS. 12A to 12D are wave form charts for explaining the behavior of the turn-off circuit shown in FIG. 11;

FIG. 13 is a configuration diagram illustrating a control circuit according to second embodiment;

FIGS. 14A to 14E are wave form charts for explaining the behavior of the control circuit according to the second embodiment;

FIG. 15 is a configuration diagram for explaining the behavior of a bidirectional switch element;

DESCRIPTION OF THE EMBODIMENT

Embodiments of the invention are described below with reference to drawings.

First Embodiment

Figure 1:
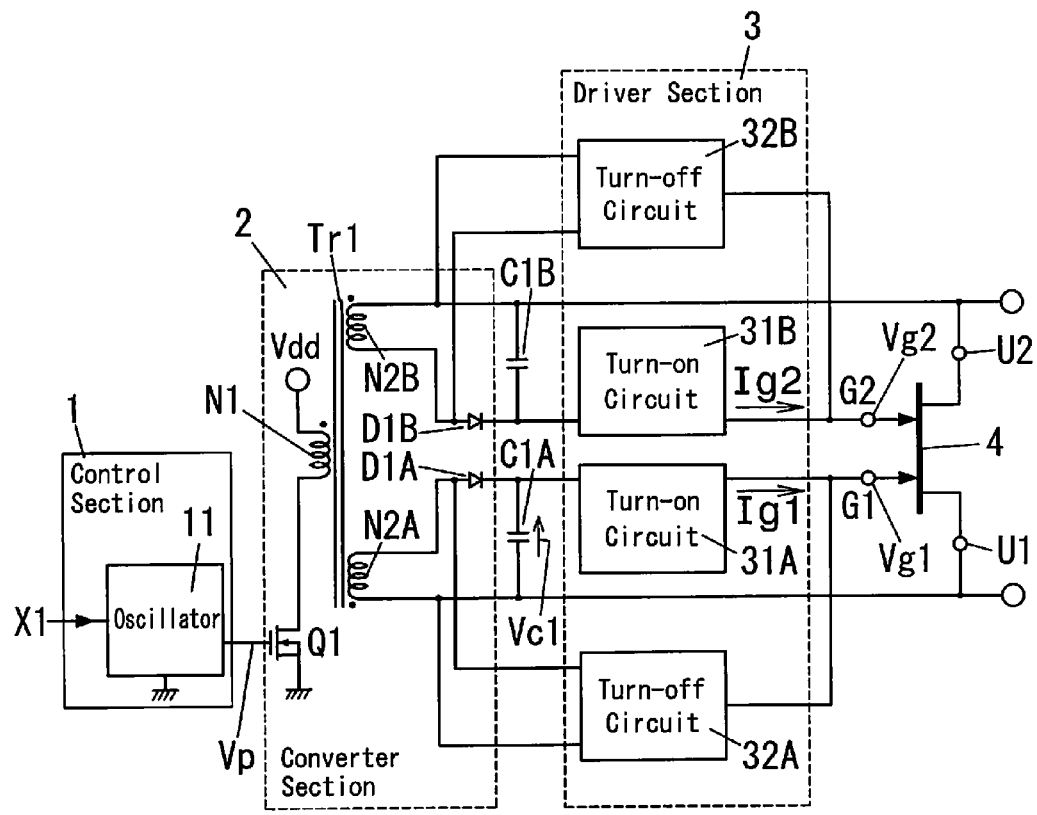
FIG. 1 is a schematic configuration diagram illustrating a driver for semiconductor switch element according to first embodiment.

FIG. 1 shows a schematic configuration of a driver for semiconductor switch element according to the embodiment. The driver of the embodiment includes a control section 1, a converter section 2, a driver section 3, and capacitors C1A, C1B. The driver is configured to drive a bidirectional switch element 4 which is an example of the semiconductor switch element. The capacitors C1A, C1B serve as "a first capacitor" of the invention.

Figure 2:
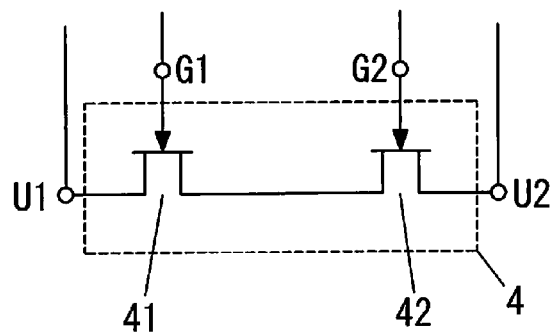
FIG. 2 is a circuit diagram illustrating a bidirectional switch element according to the first embodiment.

The bidirectional switch element 4 is a switching device that is formed of a wide-gap semiconductor having a large bandgap, such as SiC (silicon carbide) and GaN (gallium nitride). As shown in FIG. 2, the bidirectional switch element 4 is configured as a bidirectional switch formed of a pair of transistors 41, 42 that are connected in series, where each of the transistors 41, 42 has a gate, a source and a drain. In the bidirectional switch element 4, paths between the drain and the source of the transistors 41, 42 are respectively turned on (become conductive) when drive powers are applied on the respective gates (control terminals) G1, G2 of the transistors 41, 42, and thereby a series circuit of the transistors 41, 42 becomes conductive across its terminals. With regard to the bidirectional switch element 4, hereinafter, one of the terminals of the transistor 41 which is to be connected to an external load is referred to as "an output terminal U1", and one of the terminals of the transistor 42 which is to be connected to an external load is referred to as "an output terminal U2".

The control section 1 includes an oscillator 11. The oscillator 11 is configured to output a high-frequency drive signal Vp to control the switching operation of the converter section 2 in response to a control signal X1 sent from outside.

The converter section 2 is constituted by a fly-back converter utilizing a transformer Tr1 that includes a primary winding N1 and secondary windings N2A, N2B. The primary winding N1 of the transformer Tr1 is connected in series with a switching element (first switching element) Q1 of an N-type MOSFET. An operation voltage Vdd is applied across a series circuit of the primary winding N1 and the switching element Q1. The secondary winding N2A of the transformer Tr1 is connected to an anode of a rectification diode D1A, and the secondary winding N2B of the transformer Tr1 is connected to an anode of a rectification diode DIB. The capacitor CIA is connected between both ends of the secondary winding N2A via the diode D1A, and the capacitor C1B is connected between both ends of the secondary winding N2B via the diode D1B.

The switching element Q1 is turned on and off in response to a drive signal Vp outputted by the oscillator 11. The transformer T1 accumulates magnetic energy from the electric current flowing through the primary winding N1, when the switching element Q1 is turned on. When the switching element Q1 is turned off, the stored energy in the transformer Tr1 induces inductive voltages across the secondary windings N2A, N2B, thereby charging the capacitors C1A, C1B via the diodes D1A, D1B, respectively. The electric charges stored in the capacitors C1A, C1B respectively serve as electric power sources for supplying the respective gates G1, G2 of the bidirectional switch element 4 with the drive powers.

The driver section 3 includes turn-on circuits 31A, 31B and turn-off circuits 32A, 32B. The turn-on circuit 31A is configured to supply the gate G1 of the bidirectional switch element 4 with a drive power to turn-on the transistor 41, and the turn-off circuit 32A is configured to turn-off the transistor 41. The turn-on circuit 31B is configured to supply the gate G2 of the bidirectional switch element 4 with a drive power to turn-on the transistor 42 of the bidirectional switch element 4, and the turn-off circuit 32B is configured to turn-off the transistor 42.

The gate G1 of the transistor 41 is connected to a positive electrode of the capacitor C1A via a switch section (described later) of the turn-on circuit 31A. The output terminal U1 of the transistor 41 is connected to a negative electrode of the capacitor C1A.

The gate G2 of the transistor 42 is connected to a positive electrode of the capacitor C1B via a switch section of the turn-on circuit 31B. The output terminal U2 of the transistor 42 is connected to a negative electrode of the capacitor C1b.

Hereinafter, the secondary winding N2A, N2B, the diode D1A, D1B, and the capacitor C1A, C1B are respectively referred to as "a secondary winding N2", "a diode (first diode) D1", and "a capacitor C1" on a case-by-case basis. The turn-on circuit 31A, 31B, and the turn-off circuit 32A, 32B are also respectively referred to as "a turn-on circuit 31", and "a turn-off circuit 32" on a case-by-case basis.

Behavior of the driver having aforementioned structure is described below with reference to FIGS. 3A to 3E.

Figure 3:
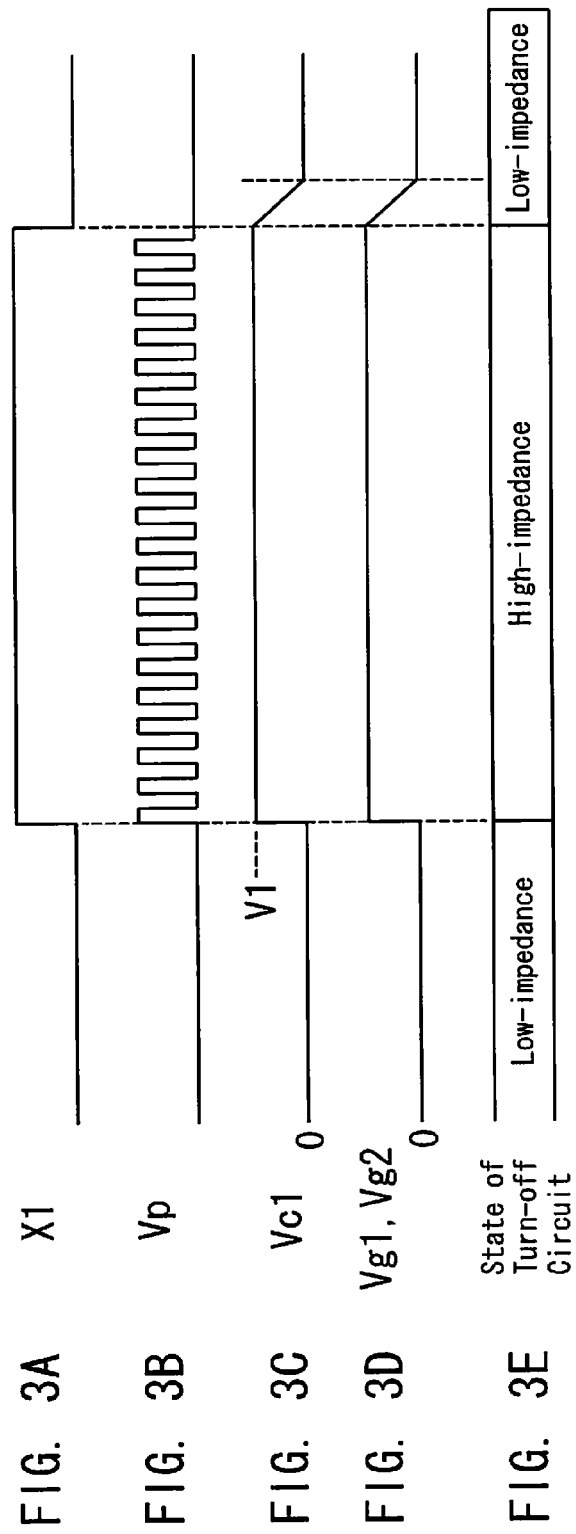
FIGS. 3A to 3E are wave form charts for explaining the behavior of the driver according to the first embodiment.

FIG. 3A shows a waveform of a control signal X1 from outside. FIG. 3B shows a waveform of a drive signal Vp outputted by the oscillator 11. FIG. 3C shows a waveform of a voltage Vc1 generated across the capacitor C1. FIG. 3D shows a waveform of a drive voltage Vg1 (Vg2) applied between the gate G1 (G2) and the output terminal U1 (U2) of the bidirectional switch element 4. FIG. 3E shows a state of the turn-off circuit 32.

The control section 1 controls the output waveform of the drive signal Vp of the oscillator 11 based on the control signal X1 from outside. When a control signal X1 of H-level is inputted for turning on the bidirectional switch element 4, the oscillator 11 outputs a drive signal Vp with high-frequency pulse form to be applied on a gate of the switching element Q1. The switching element Q1 is thereby turned on and off, the converter section 2 outputs a DC voltage, and accordingly the voltage Vc1 across the capacitor C1 increases to "voltage V1".

The turn-on circuits 31 is configured to apply drive voltages Vg1, Vg2 on the gates G1, G2 of the bidirectional switch element 4 using the electric charges stored in the capacitors C1, respectively, thereby turning-on the bidirectional switch element 4. In the embodiment, the turn-on circuit 31 has a current limitation function of limiting a drive current Ig1, Ig2 supplied to the gate G1, G2 of the bidirectional switch element 4 to less than a predetermined current.

Incidentally, in order to drive the bidirectional switch element 4 (see FIG. 2), it needs applying a drive voltage Vg1 between the gate G1 and the output terminal U1 of the transistor 41 as well as applying a drive voltage Vg2 between the gate G2 and the output terminal U2 of the transistor 42. With regard to this, it depends on the flowing direction of electric current that which of the terminals of the transistors 41, 42 serves as a drain or a source.

FIG. 15 illustrates an example circuit, in which the bidirectional switch element 4 formed of the transistors 41, 42 is connected to a resistive load Lr, and a DC voltage source E1 generating "DC voltage Vcc" is connected between both ends of a series circuit of the bidirectional switch element 4 and the resistive load Lr. In this circuit, the high-voltage side of the DC voltage source E1 is connected to the transistor 42 (output terminal U2) via the load Lr, and the low-voltage side of the DC voltage source E1 is connected to the transistor 41 (output terminal U1), and therefore the transistors 41, 42 have the drains and sources as shown in FIG. 15, respectively. That is, the drain of the transistor 42, the source of the transistor 42, the drain of the transistor 41, and the source of the transistor 41 are formed in this order from the high-voltage side of the DC voltage source E1. Note that, the drive voltage Vg1 is applied between the gate and the source of the transistor 41, whereas the drive voltage Vg2 is applied between the gate and the drain of the transistor 42.

In a case where the electric current flowing from the drain to the source of the transistor 41, 42 is comparatively small, the drain and the source of the transistor 42 have substantially same potential, since the drain-source voltage of the transistor 41, 42 is substantially 0. In this case, the gate-source voltage substantially equals the gate-drain voltage in the transistor 42. Accordingly, the gate-source voltage of the transistor 42 substantially equals the drive voltage Vg2.

When the electric current flowing from the drain to the source of the transistor 41, 42 becomes comparatively large, the drain-source voltage of the transistor 42 increases, and the source-potential becomes lower than the drain-potential in the transistor 42. In this case, the gate-source voltage becomes larger than the drive voltage Vg2 in the transistor 42. For example, assuming a case where: "the drive voltage Vg1" and "the drive voltage Vg2" are 3 [V]; "the DC voltage Vcc" is 2 [V]; and "the drain-source voltage of the transistor 42" is 1 [V], "the gate-source voltage of the transistor 42" is calculated as 4 [V], which is larger than "the drive voltage Vg2 (=3 [V])".

Figure 16:
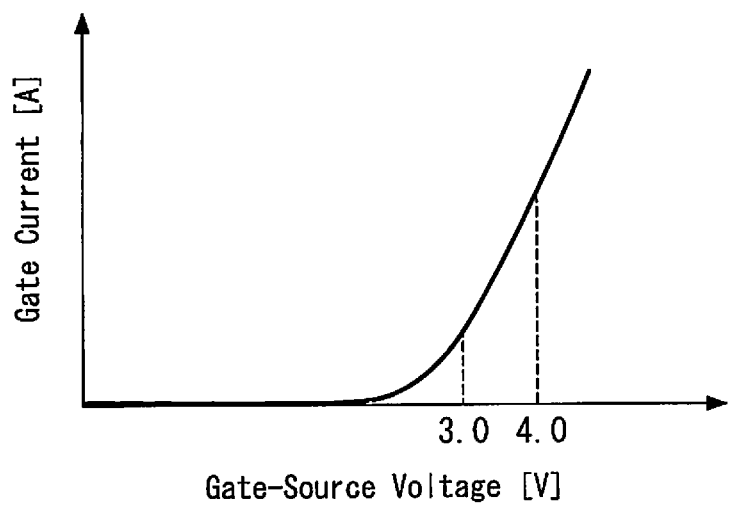
FIG. 16 is a characteristic diagram showing a relationship between a gate-source voltage and a gate current.

FIG. 16 shows a relationship between the gate-source voltage and a gate current (drive current). As seen from the figure, the gate current increases with increase of the gate-source voltage. Therefore, when the electric current flowing from the drain to the source of the transistor 42 becomes comparatively large, the drive current Ig2 supplied from the turn-on circuit 31B to the gate G2 of the bidirectional switch element 4 increases, and it causes an increase of a gate-drive power for turning-on the bidirectional switch element 4.

Note that, if the polarity of the DC voltage Vcc is reversed from that shown in FIG. 15, the drain and the source of each transistor 41, 42 are reversed as well. In this structure, if an electric current flowing from the drain to the source of the transistor 41 becomes comparatively large, the drive current Ig1 supplied from the turn-on circuit 31A to the gate G1 of the bidirectional switch element 4 increases, and it causes an increase of a gate-drive power for turning-on the bidirectional switch element 4.

With regard to this, the turn-on circuit 31 of the embodiment has the current limitation function of restricting the drive current Ig1, Ig2 so as not to exceed a predetermined current. With this function, the driver is capable of turning-on the bidirectional switch element 4 with suppressing the gate-drive power of the bidirectional switch element 4, even if an electric current flowing through the bidirectional switch element 4 becomes comparatively large.

The turn-off circuit 32 is maintained in a high-impedance state when a voltage larger than a certain value is induced across the secondary winding N2 by the operation of the converter section 2. In this state, the capacitor C1 is kept in a charged-state.

Meanwhile, when a control signal X1 of L-level is inputted for turning off the bidirectional switch element 4, the oscillator 11 outputs a drive signal Vp with a constant L-level. The switching element Q1 is thereby kept to be turned off, and the output voltage of the converter section 2 decreases to "0".

Upon the voltage across the secondary winding N2 decreasing to a predetermined voltage by the halt of the converter section 2, the turn-off circuit 32 becomes a low-impedance state to discharge the capacitor C1.

When the voltage Vc1 across the capacitor C1 decreases to "0" by the discharge of the capacitor C1, the drive voltage Vg1, Vg2 applied by the turn-on circuit 31 on the gate G1, G2 of the bidirectional switch element 4 decreases to "0". The bidirectional switch element 4 is then turned-off.

The driver of the embodiment has above structure, and the control section 1 and the bidirectional switch element 4 are insulated with each other by means of the transformer Tr1.

In addition, the turn-on circuit 31 of the embodiment can secure a sufficient drive power for the bidirectional switch element 4, since electric charge of the capacitor C1 arranged at a secondary side serves as a power source for supplying the gate G1, G2 of the bidirectional switch element 4 with the drive power.

Furthermore, the turn-off circuit 32 can reliably turn-off the bidirectional switch element 4, since the turn-off circuit 32 turns-off the bidirectional switch element 4 by way of discharging the capacitor C1.

Figure 4:
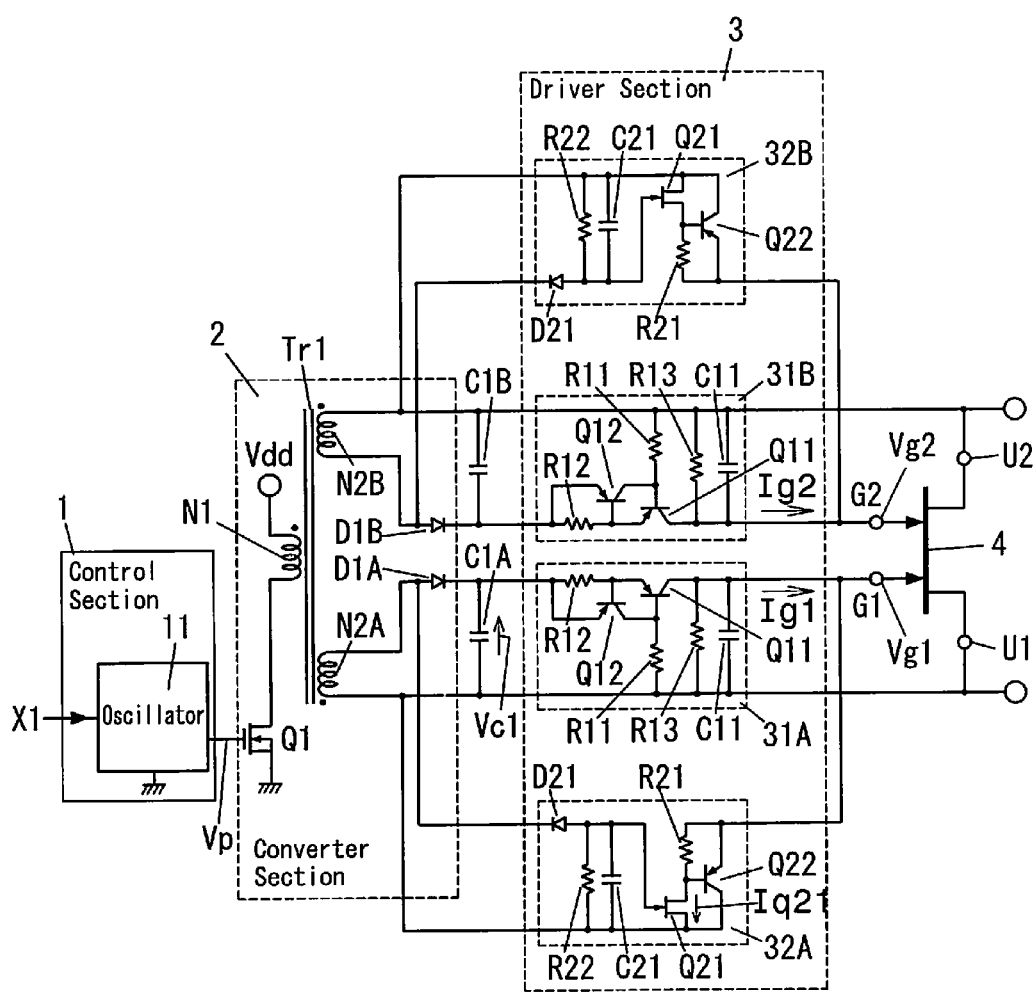
FIG. 4 is a circuit diagram illustrating the driver according to the first embodiment.

FIG. 4 shows specific circuit configuration of the turn-on circuit 31 and the turn-off circuit 32.

The turn-on circuit 31 includes a series circuit of a resistor (first resistor) R12 and a pnp transistor (first transistor) Q11, connected in series with the diode D1 (and a positive electrode of the capacitor C1). A base of the transistor Q11 is connected to a negative electrode of the capacitor C1 via a resistor (second resistor) R11. A pnp transistor (second transistor) Q12 is connected between the base of the transistor Q11 and the positive electrode of the capacitor C1. Parallel circuits, each of which is composed of a capacitor C11 and a resistor (third resistor) R13, are respectively connected between the gate G1 and the output terminal U1, and between the gate G2 and the output terminal U2 of the bidirectional switch element 4.

In the structure shown in FIG. 4, the capacitors C1 serve as "a forward capacitor" of the invention, and the capacitors C11 serve as "a backward capacitor" of the invention. The transistors Q11 (and the resistors R11) serve as "a switch section" configured to be turned off when the voltage across the forward capacitor is lower than a predetermined voltage and to be turned on when the voltage across the forward capacitor is the predetermined voltage or more.

Behavior of the turn-on circuit 31 shown in FIG. 4 is described below with reference to FIGS. 5A to 5F.

Figure 5:
FIGS. 5A to 5J are wave form charts for explaining the behavior of a turn-on circuit according to the first embodiment.

FIG. 5A shows a waveform of a drive signal Vp outputted by the oscillator 11. FIG. 5B shows a waveform of a voltage Vc1 induced across the capacitor C1. FIG. 5C shows a waveform of a drive voltage Vg1 (Vg2) applied between the gate G1 (G2) and the output terminal U1 (U2) of the bidirectional switch element 4 (i.e. waveform of a voltage across the capacitor C11). FIGS. 5D, 5E and 5F respectively show: a waveform of a current IL flowing between both ends of the bidirectional switch element 4; a waveform of a voltage VL across both ends of the bidirectional switch element 4; and a waveform of a switching loss PL generated in the bidirectional switch element 4 in the turn-on period. These waveforms of the current IL, the voltage VL, and the switching loss PL are obtained under a condition shown in FIG. 6 where, a resistive load Lr is connected to the bidirectional switch element 4, and a DC voltage source E1 generating "the DC voltage Vcc" is connected between both ends of a series circuit of the bidirectional switch element 4 and the resistive load Lr.

The oscillator 11 applies a drive signal Vp of high-frequency pulse form on the gate of the switching element Q1. The switching element Q1 turns on and off in response to the drive signal Vp, and thereby the converter section 2 outputs DC voltage. In this time, the voltage Vc1 across the capacitor C1 gradually increases.

The voltage Vc1 of the capacitor C1 is applied between an emitter and a base of the transistor Q11. Note that, the transistor Q11 is kept turning off and the capacitor C11 is not charged, until the voltage Vc1 exceeds about 0.7 [V]. During this period, the drive voltages Vg1, Vg2 of the bidirectional switch element 4 are kept "0", and the bidirectional switch element 4 is kept turning off.

The transistor Q11 turns on upon the voltage Vc1 of the capacitor C1 exceeding about 0.7 [V] (at time point t1 shown in FIGS. 5B to 5J), and the electric charge stored in the capacitor C1 is transferred to the capacitor C11 to charge the capacitor C11. The voltage across the capacitor C11 is applied on the gate G1, G2 of the bidirectional switch element 4 as the drive voltage Vg1, Vg2. As shown in FIG. 5C, the drive voltage Vg1, Vg2 rises up to "voltage V2", which is larger than a threshold voltage of the bidirectional switch element 4, at the time point t1, and then gradually increases, thereby turning on the bidirectional switch element 4.

FIGS. 5D and 5E show variation of the current IL and the voltage VL of the bidirectional switch element 4 when the aforementioned drive voltages Vg1, Vg2 are applied on the bidirectional switch element 4 under a configuration where the resistive load Lr is connected to the bidirectional switch element 4 (see FIG. 6). The current IL flowing in the bidirectional switch element 4 rises up to "positive current value I1" at the time point t1 at which the transistor Q11 turns on, and then gradually increases. The voltage VL between both ends of the bidirectional switch element 4 falls to "DC voltage V3", which is smaller than "the DC voltage Vcc" of the DC voltage source E1, at the time point t1, and then gradually decreases.

In the embodiment therefore, the bidirectional switch element 4 causes the switching loss PL in the turn-on period only after the time point t1 at which the transistor Q11 is turned on, as shown in FIG. 5F.

Figure 17:
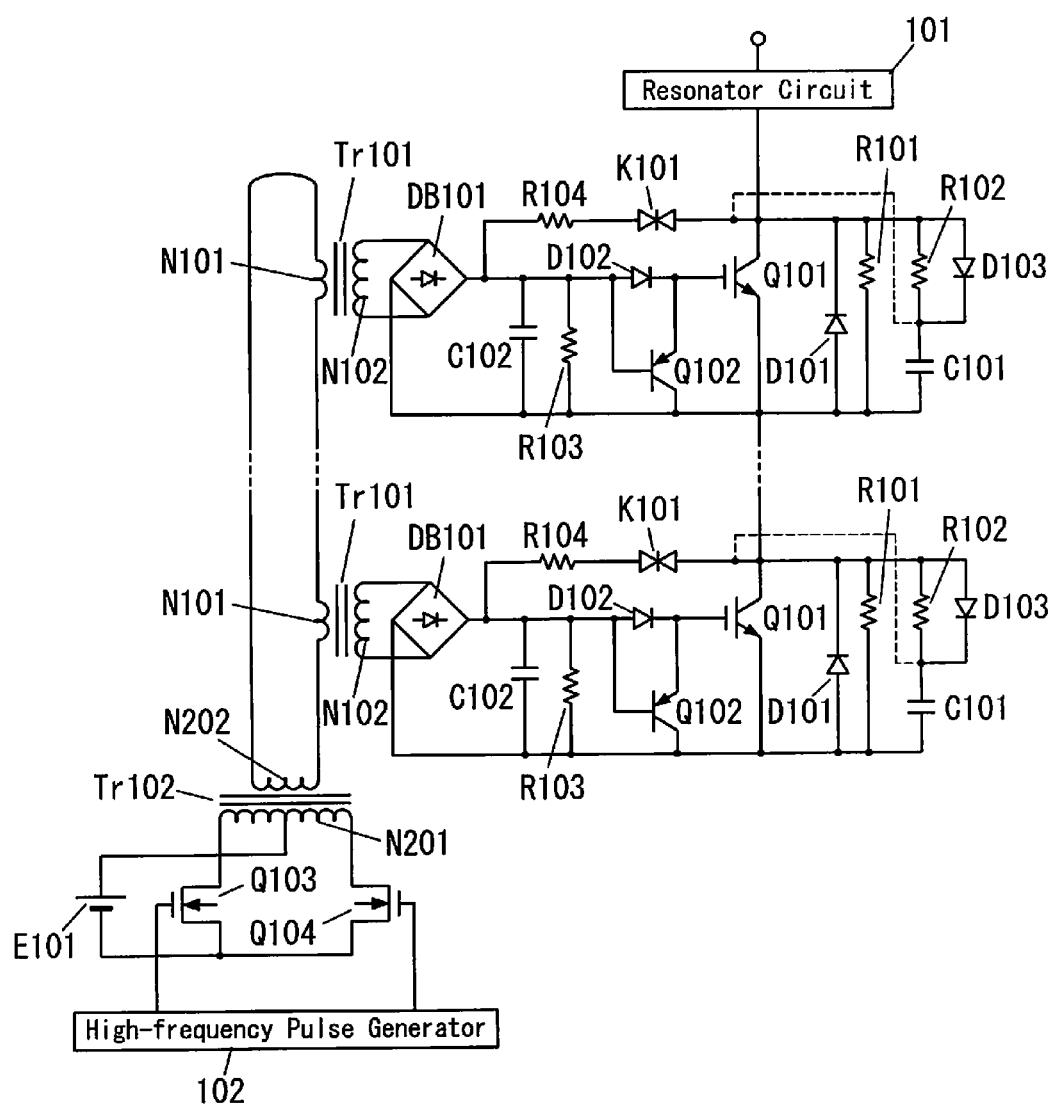
FIG. 17 is a configuration diagram illustrating a conventional driver for semiconductor switch element.

Incidentally, FIGS. 5G to 5J show waveforms of components in a case where the bidirectional switch element 4 is connected to and turned-on by the conventional driver shown in FIG. 17.

The drive voltage Vg1, Vg2 of the bidirectional switch element 4 gradually increases from "0", and the bidirectional switch element 4 turns on upon each drive voltage Vg1, Vg2 exceeds the threshold voltage of the bidirectional switch element 4. In this case, the drive voltage Vg1, Vg2 gradually increases from "0", as shown in FIG. 5G.

FIGS. 5H and 5I show variation of the current IL and the voltage VL of the bidirectional switch element 4 under the case where the drive voltages Vg1, Vg2 increase from "0". The current IL flowing in the bidirectional switch element 4 gradually increases from "0". The voltage VL between both ends of the bidirectional switch element 4 gradually decreases from "the DC voltage Vcc".

Therefore, in the case where the bidirectional switch element 4 is driven by the conventional driver shown in FIG. 17, the switching loss PL (see FIG. 5J) caused in the bidirectional switch element 4 in the turn-on period is larger than the switching loss PL (see FIG. 5F) which is caused when the bidirectional switch element 4 is turned on by the driver of the present embodiment shown in FIG. 4.

Accordingly, the driver of the present embodiment shown in FIG. 4 (including the forward capacitor, the switch section, and the backward capacitor) is capable of reducing the switching loss PL caused in the turn-on period of the bidirectional switch element 4, compared with the conventional driver.

The transistor Q12 and the resistor R12 shown in FIG. 4 serve as a current limiting circuit of the invention for limiting the current supplied to the gate G1, G2 of the bidirectional switch element 4 to less than a predetermined current. Behavior of the current limiting circuit is described below.

When the bidirectional switch element 4 turns-on, the gate G1, G2 is supplied with drive current Ig1, Ig2 through the resistor R12 and the transistor Q11. The drive current Ig1, Ig2 induces a voltage across the resistor R12 proportional thereto, and the voltage across the resistor R12 is applied between an emitter and a base of the transistor Q12. When the transistor Q12 is turned on by the increase of the drive current Ig1, Ig2, a collector current of the transistor Q12 flows through the resistor R11 to generate voltage drop at the resistor R11. A collector current of the transistor Q11 therefore decreases due to the increase of the base-emitter voltage of the transistor Q11 caused by the voltage drop of the resistor R11.

Therefore, the drive currents Ig1, Ig2 of the bidirectional switch element 4 are avoided from being excessively increased and are limited to less than predetermined values, respectively.

Accordingly, the embodiment enables to turn-on the bidirectional switch element 4 without a need of increasing the gate drive power of the bidirectional switch element 4.

Behavior of the turn-off circuit 32 (32A, 32B) is described below with reference to FIGS. 7A to 7D.

As shown in FIG. 4, in the turn-off circuit 32, a cathode of a diode (second diode) D21 is connected to one end (first end) of the secondary winding N2, and an anode of the diode D21 is connected to the other end (second end) of the secondary winding N2 with a parallel circuit of a capacitor C21 and a resistor (fourth resistor) R22 interposed therebetween. The parallel circuits of the capacitor C21 and the resistor R22 serve as "a parallel circuit of a second capacitor and a resistor" of the invention.

In addition, the anode of the diode D21 is connected to a gate of a switching element Q21. The switching element Q21 is constituted by an N-type JFET of a depletion-type. A drain of the switching element Q21 is connected to the gate G1, G2 of the bidirectional switch element 4 via a resistor (fifth resistor) R21. A source of the switching element Q21 is connected to the second end of the secondary winding N2. The turn-off circuit 32 further includes a pnp transistor Q22, where a base of the transistor Q22 is connected to the drain of the switching element Q21, an emitter of the transistor Q22 is connected to the gate G1, G2 of the bidirectional switch element 4, and a collector of the transistor Q22 is connected to the second end of the secondary winding N2. The transistors Q22 serve as "a second switching element" of the invention. The switching elements Q21 serve as "a depletion-type third switching element" of the invention.

FIG. 7A shows a waveform of a control signal X1 from outside. FIG. 7B shows a waveform of a drive voltage Vg1 (Vg2) applied between the gate G1 (G2) and the output terminal U1 (U2) of the bidirectional switch element 4 (i.e. waveform of a voltage across the capacitor C11). FIG. 7C shows a drive voltage Vg21 applied between the gate and the source of the switching element Q21. FIG. 7D shows a driving state of the switching element Q21.

When a control signal X1 of H-level is inputted, the switching element Q1 of the converter section 2 is thereby operated to turn on and off to generate an induced voltage across the secondary winding N2. The capacitor C21 is charged by the induced voltage, and the switching element Q21 turns off by being applied on the gate of the switching element Q21 with a negative drive voltage Vg21 induced across the capacitor C21. When the switching element Q21 turns off, the transistor Q22 is then turned off. The turn-off circuit 32 is turned into a high-impedance state, thereby keeping the capacitors C1 and C11 in charged-states.

When a control signal X1 of L-level is inputted, the switching element Q1 of the converter section 2 is thereby turned off, and then the voltage across the secondary winding N2 decreases to "0". The capacitor C21 is therefore discharged through the resistor R22. The depletion-type switching element Q21 is then turned on by being applied on the gate with a voltage across the capacitor C21 after discharge (which is approximately 0) as a drive voltage Vg21. When the switching element Q21 turns on, a voltage is generated across the resistor R21 to cause to turn on the transistor Q22. The turn-off circuit 32 is turned into a low-impedance state, thereby discharging the electric charge stored in the capacitors C1 and C11 through the switching element Q21 and the transistor Q22.

When the drive voltage Vg1, Vg2 of the bidirectional switch element 4 decreases to "threshold voltage Vs1" by the discharge of the capacitors C1 and C11, the bidirectional switch element 4 is turned off. When the drive voltage Vg1, Vg2 decreases further from this state, the voltage across the resistor R21 decreases to cause to turn off the transistor Q22. In this state (time point t2 shown in FIGS. 7B to 7D), discharging path for discharging the electric charges stored in the capacitors C1, C11 is limited to the switching element Q21. Accordingly, discharging rate of the capacitors C1 and C11 decrease, and the gradient of the drive voltage Vg1, Vg2 decreases (time period T1 shown in FIGS. 7B to 7D). As a result, the capacitor C1, C11 allows to have a certain amount of electric charge until the control signal X1 is shifted into H-level. Therefore, in case of turning on the bidirectional switch element 4 again by supplying energy from the secondary winding N2, the bidirectional device 4 can be turned-on again with a fewer energy from the secondary winding N2, since the capacitors C1, C11 have residual energy. Also, the bidirectional switch element 4 can be turned-on in a shorter time with a higher switching speed.

The turn-off circuit 32 may be configured that a zener diode (first zener diode) ZD21 is connected in series with the emitter of the transistor Q22, as shown in FIG. 8. That is, an anode of the zener diode ZD21 is connected to the emitter of the transistor Q22. The zener diode ZD21 may have such a zener voltage (breakdown voltage) that the drive voltage Vg1, Vg2 of the bidirectional switch element 4 decreases approximately to "the threshold voltage Vs1" at the time point t2 (see FIG. 7B). For example, the zener diode ZD21 may have a zener voltage slightly smaller than "the threshold voltage Vs1" for the drive voltage Vg1, Vg2 of the bidirectional switch element 4. Utilization of the zener diode ZD21 allows to increase the residual energy of the capacitors C1, C11. Therefore, this configuration can further reduce a required drive power for turning-on and have a further high switching speed.

Incidentally, when the switching element Q1 is turned off by being inputted the control signal X1 of L-level, the voltage across the secondary winding N2 gradually decreases and the capacitor C21 of the turn-off circuit 32 is discharged through the resistor R22. The discharge time depends on a time constant according to factors of the capacitor C21 and the resistor R22.

When the control signal X1 is shifted from H-level to L-level, the capacitor C21 starts to discharge, and thereby the drive voltage Vg21 of the switching element Q21 gradually increases from a negative value to "0" in accordance with the time constant according to the factors of the capacitor C21 and the resistor R22, as shown in FIGS. 9A to 9D. After the drive voltage Vg21 increases to "threshold voltage Vs2" of the switching element Q21, an on-resistance of the switching element Q21 gradually decreases and a discharge current Iq21 flowing from the capacitors C1, C11 to the drain of the switching element Q21 gradually increases. The discharge current Iq21 serves as a base current of the transistor Q22, and therefore a collector current of the transistor Q22 also gradually increases. That is, the electric charges stored in the capacitors C1, C11 are discharged through the switching element Q21 and the transistor Q22 according to the time constant determined by the factors of the capacitor C21 and the resistor R22.

The drive voltage Vg1, Vg2 of the bidirectional switch element 4 gradually decreases in the turn-off period with a small gradient (see time period T2 shown in FIGS. 9B to 9D).

Figure 10:
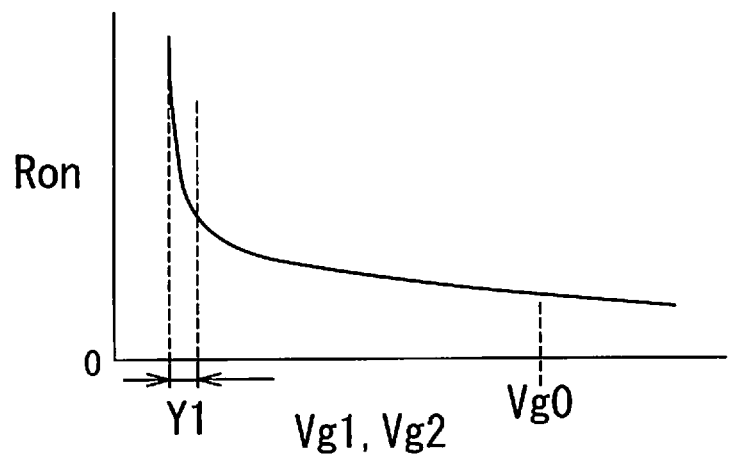
FIG. 10 is a characteristic diagram of the bidirectional switch element according to the first embodiment.

FIG. 10 shows a relation between an on-resistance Ron across the drain to the source and a drive voltage Vg1, Vg2 of the bidirectional switch element 4. As seen from the figure, the on-resistance Ron sharply decreases in a low-voltage region Y1 when the drive voltage Vg1, Vg2 increases from 0 [V]. This sharp variation of the on-resistance Ron causes a drastic variation in the drain-source voltage and the drain current of the bidirectional switch element 4, and causes a harmonic noise.

With regard to this, the turn-off circuit 32 of the embodiment includes the parallel circuit of the capacitor C21 and the resistor R22 (i.e. parallel circuit of a second capacitor and a resistor) and the switching element Q21 (i.e. third switching element), as described above. The embodiment therefore enables to decrease the drive voltage Vg1, Vg2 of the bidirectional switch element 4 slowly with a small gradient in the turn-off period, and thereby suppressing a drastic variation of the on-resistance of the bidirectional switch element 4 and reducing the harmonic noise.

Figure 11:
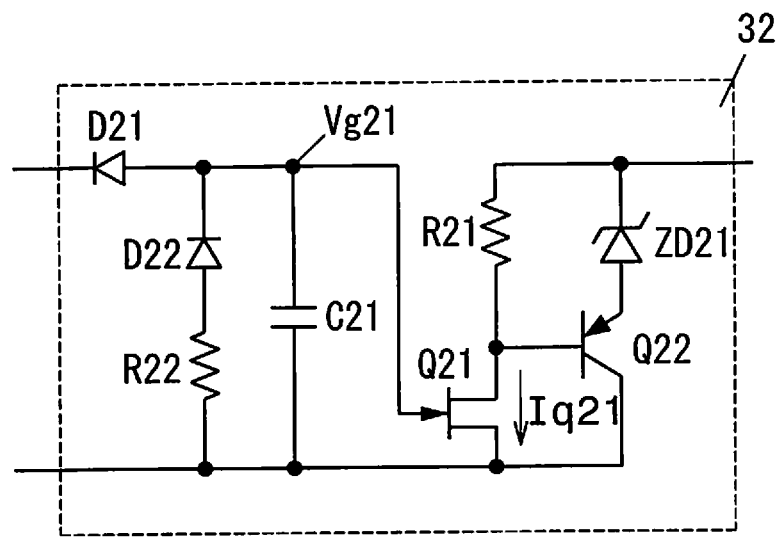
FIG. 11 is a circuit diagram illustrating yet another turn-off circuit according to the first embodiment.

The turn-off circuit 32 may be configured that a diode (third diode) D22 is connected in series with the resistor R22, and the capacitor C21 is connected in parallel with a series circuit of the resistor R22 and the diode D22, as shown in FIG. 11. The diode D22 is connected in a direction that forward direction thereof aligns with the discharging path of the capacitor C21.

FIGS. 12A to 12D show waveforms of components according to this configuration. In FIGS. 12A to 12D, solid lines indicate the waveforms with regard to the turn-off circuit 32 shown in FIG. 11 (i.e. including the diode D22), and dashed-dotted lines indicate the waveforms with regard to the turn-off circuit 32 shown in FIG. 4 (i.e. not including the diode D22).

In the configuration of the turn-off circuit 32 shown in FIG. 11, when a control signal X1 is shifted from H-level to L-level, the capacitor C21 is discharged through the resistor R22 and the diode D22. The drive voltage Vg21 (voltage across the capacitor C21) of the switching element Q21 then gradually increases from a negative voltage to "0" according to the time constant determined by the factors of the capacitor C21 and the resistor R22. Since including the diode D22, this configuration has a drive voltage Vg21 smaller by the magnitude of the forward voltage Vf (about 0.7 [V]) of the diode D22, compared with a case where the diode D22 is not provided (shown in FIG. 4). Accordingly, this configuration has a smaller discharge current Iq21 flowing from the capacitors C1, C11 to the drain of the switching element Q21 as well as has a smaller collector current of the transistor Q22, compared with a case where the diode D22 is not provided.

As a result, this configuration enables to decrease the drive voltage Vg1, Vg2 of the bidirectional switch element 4 further slowly with a smaller gradient in the turn-off period, compared with a case where the diode D22 is not provided. This configuration therefore further suppresses a variation of the on-resistance of the bidirectional switch element 4 and further reduces the harmonic noise.

Second Embodiment

FIG. 13 shows a configuration of a control circuit (control section) 1 of the embodiment. The control circuit 1 includes an oscillator 12, a delay circuit 13, a D-A converter 14, and a comparator 15.

As shown in FIGS. 14A to 14E, the oscillator 12 outputs a signal X2 of a sinusoidal wave shape in response to the control signal X1 of H-level, to a non-inverting input terminal of the comparator 15. The delay circuit 13 outputs a delay signal X3, which is in L-level when receiving a control signal X1 of L-level and which is shifted from L-level to H-level upon elapse of a delay time Td after the shift of the control signal X1 from L-level to H-level. The D-A converter 14 outputs a threshold signal X4 (shown as a dotted-dash line in FIG. 14B), which is at "threshold voltage V4" when the delay signal X3 is in L-level and at "threshold voltage V5" when the delay signal X3 is in H-level. Note that, the threshold voltage V4 is larger than the threshold voltage V5.

The comparator 15 compares the sinusoidal signal X2 with the threshold signal X4, and outputs a drive signal Vp having a duty cycle depending on the comparison result, to a gate of a switching element Q1. The drive signal Vp has a comparatively short H-level period (i.e. having small duty cycle) during counting the delay time Td, and a comparatively long H-level period (i.e. having large duty cycle) after the elapse of the delay time Td.

During the turn-on period of the bidirectional switch element 4, a comparatively small (suppressed) energy is supplied into the capacitor C1A (and C1B) before the elapse of the delay time Td, and comparatively large (increased) energy is supplied after the elapse of the delay time Td.

As a result, during the turn-on period of the bidirectional switch element 4, the drive voltages Vg1, Vg2 increase slowly with a small gradient before the elapse of the delay time Td, and increase sharply with a large gradient after the elapse of the delay time Td to reach "drive voltage Vg0" (see FIG. 10) at which the on-resistance Ron of the bidirectional switch element 4 being sufficiently small, as shown in FIG. 14E. That is, the embodiment is configured to change the duty ratio of the switching element Q1 during the turn-on period of the bidirectional switch element 4, thereby increasing the drive voltage applied on the gate of the bidirectional switch element 4 after changing the duty ratio.

The embodiment increases slowly the drive voltages Vg1, Vg2 of the bidirectional switch element 4 in early stage of the turn-on period, and thereby suppressing a drastic variation of the on-resistance of the bidirectional switch element 4. Therefore, the embodiment can reduce the harmonic noise.

Note that, if increasing the drive voltages Vg1, Vg2 constantly to "the drive voltage Vg0" with a small gradient as shown in a dotted-dash line Z1 in FIG. 14E, it takes a large time to turn-on the bidirectional switch element 4. This configuration has a concern of deteriorating the regularity of the switching operation and increasing a switching loss.

On the contrary, the embodiment is configured to sharply increase the drive voltages Vg1, Vg2 with a large gradient after the elapse of the delay time Td, thereby shortening a required time for turning-on. Accordingly, the embodiment has an improved regularity of the switching operation and suppressed switching loss.

The control section 1 may be configured to variably control the duty ratio of the drive signal Vp outputted to the gate of the switching element Q1 in response to a duty-signal inputted from outside.

Third Embodiment

Figure 18:
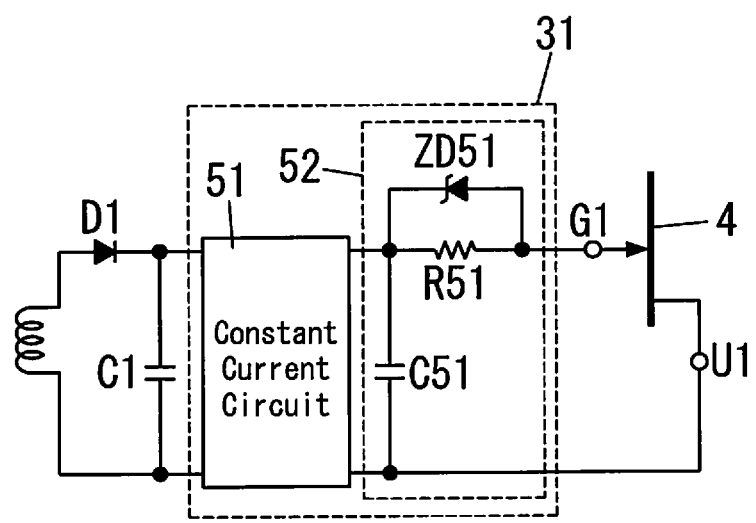
FIG. 18 is a configuration diagram illustrating a turn-on circuit according to third embodiment.

FIG. 18 shows a schematic configuration of a turn-on circuit 31 of the embodiment.

The turn-on circuit 31 of the embodiment includes: a constant current circuit 51 connected to a capacitor (first capacitor; forward capacitor) C1; and a noise-reduction circuit 52 connected to the constant current circuit 51. The noise-reduction circuit 52 of the embodiment includes: a capacitor (backward capacitor) C51; and a parallel circuit of a resistor (sixth resistor) R51 and a zener diode (second zener diode) ZD51. The capacitor C51 is connected in parallel with the capacitor C1 via the constant current circuit 51. The parallel circuit of the resistor R51 and the zener diode ZD51 is connected between an output terminal of the constant current circuit 51 and a gate G1 (G2) of the bidirectional switch element 4. In detail, a cathode of the zener diode ZD51 is connected to the output terminal of the constant current circuit 51 (and positive electrode of the capacitor C51), and an anode of the zener diode ZD51 is connected to the gate G1 (G2) of the bidirectional switch element 4. The zener diode ZD51 preferably has a zener voltage smaller than a product of the resistance value of the resistor R51 and an output current value of the constant current circuit 51. The constant current circuit 51 is connected between the capacitor C1 and the capacitor C51. The constant current circuit 51 is configured to output a constant current to the positive electrode side of the capacitor C51. The constant current circuit 51 is configured to keep a current supplied to a control terminal (i.e. gate G1, G2) of a semiconductor switch element (the bidirectional switch element 4) at constant. That is, the turn-on circuit 31 of the embodiment is configured to output a constant current to the gate G1, G2 in an equilibrium state.

Figure 19A:
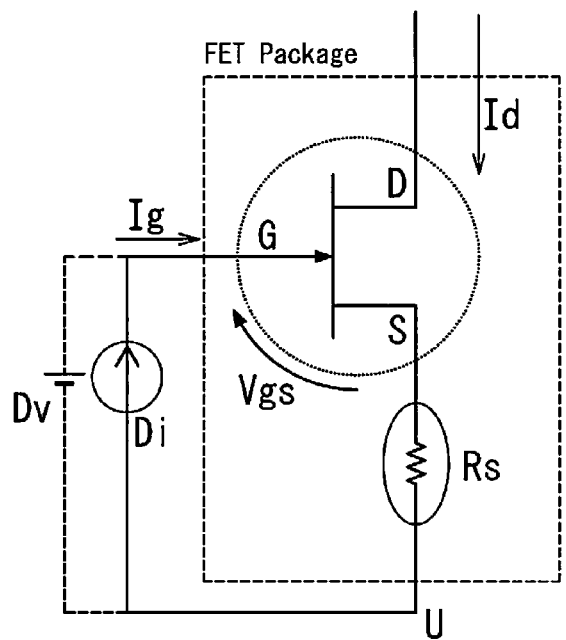
FIG. 19A is a configuration diagram for explaining the behavior of a driver when a junction-gate type FET is driven.
Figure 19B:
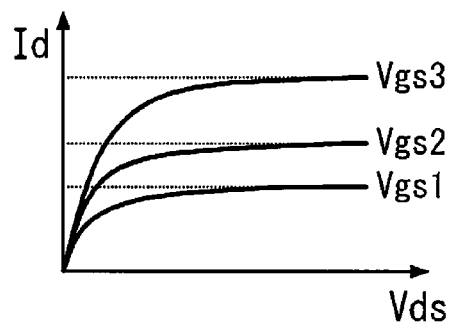
FIG. 19B is a characteristic diagram showing a schematic relationship between a gate-source voltage and a device current according to a junction-gate type FET.
Figure 19C:
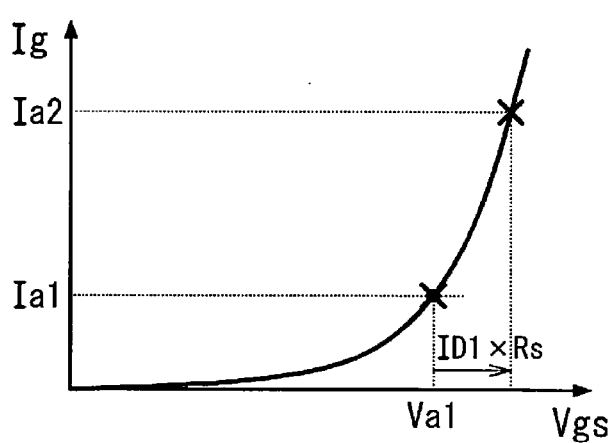
FIG. 19C is a characteristic diagram showing a schematic relationship between a gate-source voltage and a gate current according to a junction-gate type FET.

Here, it is described behavior of a constant voltage driver Dv configured to drive a junction-gate type FET with applying a constant voltage, and behavior of a constant current drive Di configured to drive a junction-gate type FET with applying a constant current, with referring FIGS. 19A to 19C.

FIG. 19A shows a junction-gate type FET having a diode structure in a region between a gate G and a source S. In this FET, there exists a source (S) side parasitic resistance Rs (e.g. resistance of a wiring on a semiconductor chip, resistance of a semiconductor package, and the like) at a region between the source S and an output terminal U of a FET package. Therefore, when a current (hereinafter referred to as "device current Id") flows between the source S and a drain D, it causes a voltage drop ("Id*Rs") across the parasitic resistance Rs in proportion to the device current Id. Therefore, the relation between the magnitude of the drive voltage Vg (voltage between the gate G and the output terminal U) and the magnitude of the gate-source voltage Vgs (voltage between the gate G and the source S) is represented as the equation "Vg=Vgs+Id*Rs".

In the junction-gate type FET, maximum value of the device current Id is determined depending on the magnitude of the gate-source voltage Vgs, as shown in FIG. 19B. FIG. 19B illustrates relations between the voltage Vds applied across the drain-source (represented in the horizontal axis) and the device current Id (represented in the vertical axis) in cases that the magnitudes of the gate-source voltage Vgs are "Vgs1", "Vgs2", "Vgs3" (Vgs1<Vgs2<Vgs3). As seen from FIG. 19B, the maximum value of the device current Id increases with increase of the gate-source voltage Vgs.

As shown in FIG. 19C, junction-gate type FET generally has a characteristic that the gate current Ig increases with increase of the gate-source voltage Vgs.

If there wants to secure the maximum value of the device current Id larger than e.g. "ID1", magnitude of the gate-source voltage Vgs is required to be larger than a certain value, as is suggested by FIG. 19B. "The certain value" of the gate-source voltage Vgs required is referred to as "Va1", hereinafter. The magnitude of the gate current Ig when the magnitude of the gate-source voltage Vgs is "Va1" is defined as "Ia1", as shown in FIG. 19C.

As seen from FIGS. 19A to 19C, in case of driving the junction-gate type FET with a constant voltage (i.e. in case the driver Dv applies a constant drive voltage between the gate G and the output terminal U), if there wants to secure the maximum value of the device current Id larger than "ID1", the required magnitude of the drive voltage Vg (=Vgs+Id*Rs) is "Va1+ID1*Rs" or more (in other words, if there wants to secure the maximum value of the device current Id larger than "ID1", it needs to set the magnitude of the drive voltage of the driver Dv at "Va1+ID1*Rs" or more). Therefore, in a case where the FET is driven by the constant voltage driver Dv and the device current Id of magnitude "ID1" is flown in the FET, the magnitude of the drive power (electric power consumed at the gate) is represented as "Ia1*(Va1+ID1*Rs)=Pa1".

If the drive current Id is decreased from this state to about "0", the magnitude of the voltage generated at the parasitic resistance Rs also decreases to about "0". Due to the decrease of the drive current Id, the magnitude of the gate-source voltage Vgs becomes equal to the drive voltage Vg (="Va1+ID1*Rs") of the driver Dv (that is, the magnitude of the gate-source voltage Vgs increases by the value "ID1*Rs"). Therefore, the magnitude of the gate current Ig increases to "Ia2" (>Ia1) in response to the decrease of the device current Id in an exponential manner along the characteristic curve of FIG. 19C. The magnitude of the drive power in this time is represented as "Ia2*(Va1+ID1*Rs)", which is larger than "Pa1".

That is, the magnitude of the drive power of the constant voltage driver Dv, which can secure the magnitude of the device current Id of the FET larger than "ID1", is equal to or larger than "Pa1".

On the contrary, in case of driving the junction-gate type FET with a constant current (i.e. in case the driver Di applies a constant gate current on the gate), the diode structure between the gate and source is biased with a constant current. The gate-source voltage Vgs is maintained constant regardless of the device current Id. Therefore, if there wants to secure the maximum value of the device current Id larger than "ID1" with a constant current drive of the FET, the required magnitude of the gate current Ig is "Ia1" (at which the magnitude of the gate-source voltage Vgs is "Va1"). In this case, the magnitude of the drive voltage Vg applied on the FET (between the gate G and the output terminal U) by the driver Di is represented as "Va1+Id*Rs". The magnitude of the drive voltage Vg therefore reaches its peak of "Va1+ID1*Rs" when the magnitude of the draindevice current Id is "ID1". The magnitude of the drive power of this time is represented as "Ia1*(Va1+ID1*Rs)=Pa1".

Note that, when the magnitude of the device current Id is smaller than "ID1", the magnitude of the drive power is represented as "Ia1*(Va1+Id*Rs)", and which is smaller than "Pa1".

That is, the magnitude of the drive power of the constant current driver Dv, which can secure the magnitude of the device current Id of the FET larger than "ID1", is equal to or smaller than "Pa1".

In conclusion, the drive power of the constant current driver is smaller than that of the constant voltage driver.

The turn-on circuit 31 of the embodiment is configured to output a constant current to the control terminal, and therefore can reduce the drive power (power consumption) compared with a constant voltage driver.

The turn-on circuit 31 of the embodiment includes the noise-reduction circuit 52. Behavior of the turn-on circuit 31 of the embodiment is described below with referring FIG. 20.

Figure 20:
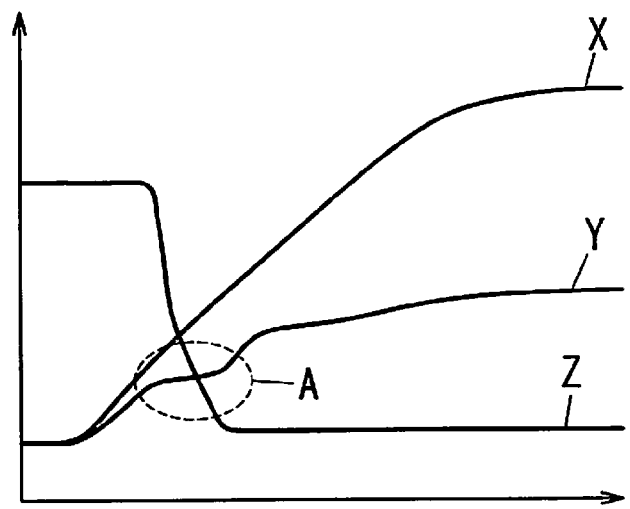
FIG. 20 is a characteristic diagram for explaining the behavior of a driver for semiconductor switch element and a bidirectional switch element according to the third embodiment.

In FIG. 20, the horizontal axis represents "time", and the vertical axis represents "voltage". In FIG. 20, line "X" indicates a time change of an output voltage of the constant current circuit 51; line "Y" indicates a time change of an output voltage of the noise-reduction circuit 52 (i.e. drive voltage Vg1, Vg2); and line "Z" indicates a time change of a voltage VL between both ends of the bidirectional switch element 4 under a condition that the bidirectional switch element 4 is connected to a resistive load Lr (see FIG. 6).

As shown in the line "X" of FIG. 20, the output voltage of the constant current circuit 51 increases with a constant gradient with time.

As shown in the line "Y" of FIG. 20, the output voltage of the noise-reduction circuit 52 increases with a constant gradient until it reaches a threshold voltage of the bidirectional switch element 4. As described above, there is a possibility of causing an increase of harmonic noise when the drive voltage Vg1, Vg2 reaches the threshold voltage or more, since the on-resistance Ron between the drain and the source sharply decreases (see FIG. 10). With regard to this, in the turn-on circuit 31 of the embodiment, the time change rate of the drive voltage Vg1, Vg2 decreases when the drive voltage Vg1, Vg2 reaches the threshold voltage of the bidirectional switch element 4, due to a gate charge characteristics of the bidirectional switch element 4. In addition, because including the resistor R51, the turn-on circuit 31 of the embodiment can adjust a period of time (region "A" shown in FIG. 20) in which the time change rate of the drive voltage Vg1, Vg2 decreases, by means of the resistor R51 (i.e. time change of the on-resistance Ron can be adjusted by the resistor R51). Accordingly, the embodiment can reduce the noise in the turn-on period.

The noise-reduction circuit 52 of the embodiment is configured to increase an input impedance of the control terminal (gate G1, G2) when the semiconductor switch element (bidirectional switch element 4) is turned-on. In detail, the noise-reduction circuit 52 of the embodiment includes: the resistor R51 connected in series with the output terminal of the constant current circuit 51; and the backward capacitor (capacitor C51) connected in parallel with the first capacitor (capacitor C1) at the output terminal side of the constant current circuit 51. With this configuration, the embodiment can reduce the noise in the turn-on period.

Further, the noise-reduction circuit 52 of the embodiment is configured to change the input impedance of the control terminal of the semiconductor switch element in response to the change of the voltage applied on the control terminal. In detail, the noise-reduction circuit 52 of the embodiment further includes the zener diode ZD51 connected in parallel with the resistor R51. In this configuration, when the voltage across the resistor R51 exceeds the zener voltage of the zener diode ZD51, the zener diode ZD51 becomes conductive to flow therein an electric current from the constant current circuit 51. Therefore, when a sufficient time lapsed after turning-on the semiconductor switching device (i.e. in an equilibrium state), an electric current flows from the constant current circuit 51 to the gate G1 (G2) through the parallel circuit of the resistor R51 and the zener diode ZD51.

As an example, it is assumed that the resistor R51 has a resistance value of 5.1 [kΩ] and the constant current circuit 51 outputs a constant current of 5 [mA]. If the zener diode ZD51 is not provided, magnitude of the induced voltage across the resistor R51 is about 25 [V] in an equilibrium state. On the contrary, when the zener diode ZD51 having a zener voltage of 3.6 [V] is employed, magnitude of the voltage induced across the resistor R51 is about 3.6 [V] in an equilibrium state. Therefore, the consumed power in the resistor R51 can be reduced compared with the case where the zener diode ZD51 is not provided.

The embodiment therefore can reduce the consumed power in an equilibrium state by virtue of the zener diode ZD51.

Figure 21:
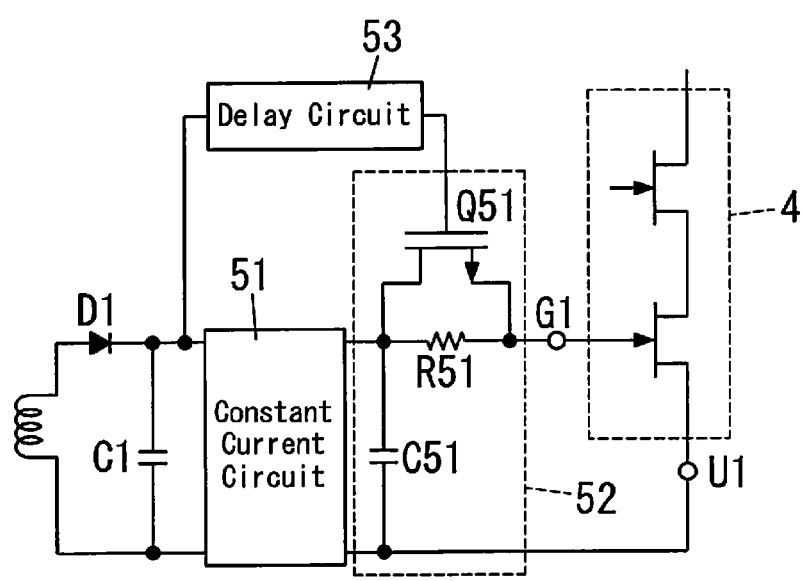
FIG. 21 is a configuration diagram illustrating another turn-on circuit according to the third embodiment.

The noise-reduction circuit 52 may have a structure including: a resistor R51 connected in series with the constant current circuit 51; a switching element (fourth switching element) Q51 connected in parallel with the resistor R51; and a delay circuit 53 that switches the switching element Q51 from an off-state to an on-state at a predetermined time after the converter section 2 starting output power, as shown in FIG. 21. The delay circuit 53 is configured to switch the switching element Q51 from an off-state to an on-state upon elapse of a predetermined time after the converter section 2 starting output.

That is, the noise-reduction circuit 52 shown in FIG. 21 is configured to increase the input impedance of the control terminal (gate G1, G2) of the semiconductor switch element (bidirectional switch element 4) when the semiconductor switch element is turned on, as with the configuration shown in FIG. 18.

The noise-reduction circuit 52 shown in FIG. 21 is also configured to decrease the input impedance of the control terminal at a predetermined time after start of the supply of the drive power to the control terminal of the semiconductor switch element. In detail, the noise-reduction circuit 52 of this configuration further includes: the switching element Q51 connected in parallel with the resistor R51; and the delay circuit 53 that switches the switching element Q51 from an off-state to an on-state at a predetermined time after the converter section 2 starting output.

In this configuration, an electric current flows from the constant current circuit 51 to the gate G1, G2 through the resistor R51 in a period immediately after the converter section 2 starts output. Therefore, this configuration enables to reduce the noise in the turn-on period. In an equilibrium state, an electric current flows from the constant current circuit 51 to the gate G1, G2 through a parallel circuit of the resistor R51 and the switching element Q51. Therefore, the consumed power in the resistor R51 can be reduced compared with the case where the switching element Q51 is not provided.

This configuration therefore can reduce the consumed power in an equilibrium state by virtue of the switching element Q51.

Figure 22:
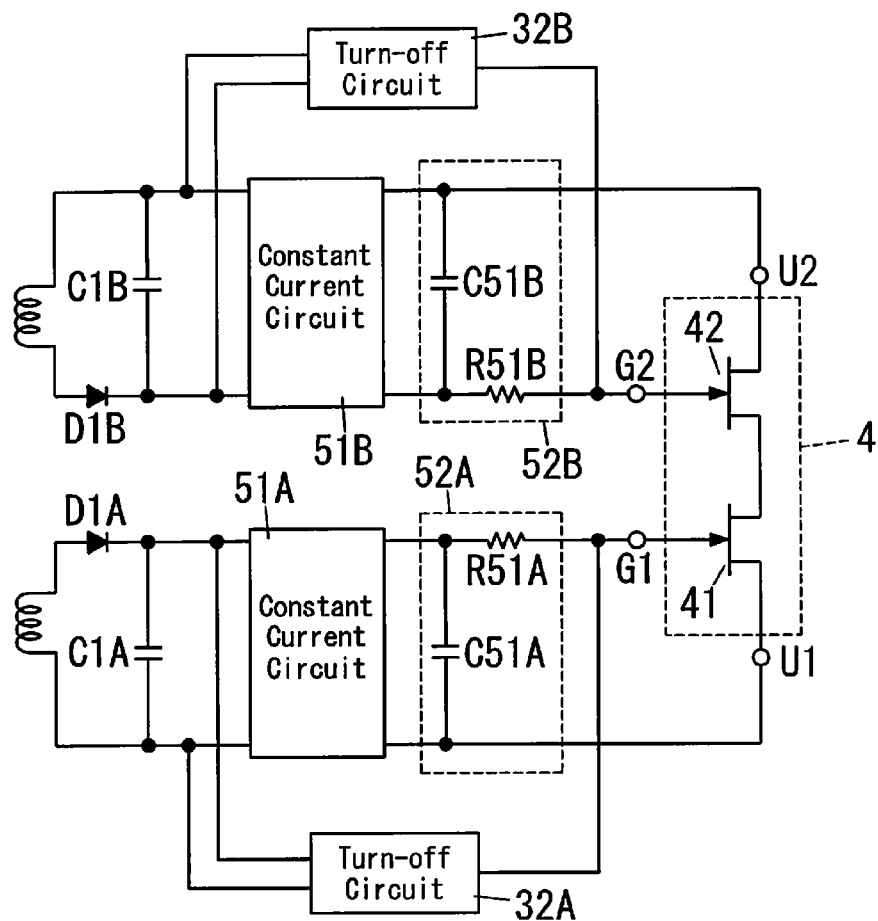
FIG. 22 is a configuration diagram illustrating the driver according to the third embodiment.

As shown in FIG. 22, it is preferred that the driver includes turn-on circuits 31 (31A, 31B) adapted respectively to the transistors 41, 42 of the bidirectional switch element 4, and each of the turn-on circuits 31A, 31B includes an above-described noise-reduction circuit 52 (52A, 52B). In this configuration, each of the control terminals (gates G1, G2) of the semiconductor switch element (bidirectional switch element 4) is connected to a corresponding noise-reduction circuit 52 (52A, 52B). In a configuration shown in FIG. 15 in which the high-voltage side of the DC voltage source E1 is connected to the output terminal U2 of the transistor 42, the noise-reduction circuit 52B connected to the high-side (high voltage side) control terminal (gate G2) is connected between the high-side control terminal U2 and the control terminal (gate G2) of the bidirectional switch element 4; and the noise-reduction circuit 52A connected to the low-side (low voltage side) control terminal (gate G1) is connected between the low-side control terminal U1 and the control terminal (gate G1) of the bidirectional switch element 4. As a result, the driver as a whole has a reduced noise. Note that, the noise-reduction circuit 52A (52B) in FIG. 22 includes only a resistor 51A (51B) and a capacitor C51A (C51B), but the noise-reduction circuit 52A (52B) may further includes a zener diode ZD51 as illustrated in FIG. 18 or a switching element Q51 as illustrated in FIG. 21. The configuration of FIG. 22 includes first capacitors C1 (C1A, C1B) and turn-off circuits 32 (32A, 32B) with respect to the transistors 41, 42, respectively.

Figure 23:
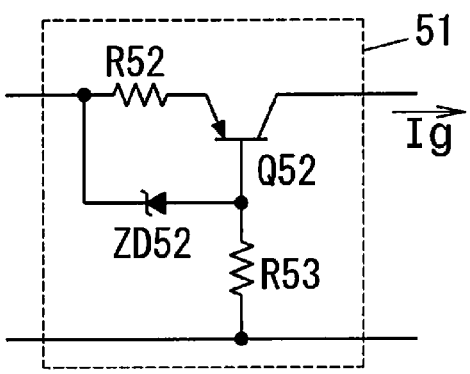
FIG. 23 is a circuit diagram illustrating a constant current circuit according to third embodiment.

The constant current circuit 51 of the embodiment is preferred to have a structure shown in FIG. 23. The constant current circuit 51 of this structure includes a series circuit of a resistor (seventh resistor) R52 and a pnp transistor (third transistor) Q52, connected in series with the diode D1 (positive electrode of the capacitor C1). A base of the transistor Q52 is connected to a negative electrode of the capacitor C1 via a resistor R53. A zener diode (third zener diode) ZD52 is connected between the positive electrode of the capacitor C1 and the base of the transistor Q52. In detail, an anode of the zener diode ZD52 is connected to the base of the transistor Q52, and a cathode of the zener diode ZD52 is connected to the positive electrode of the capacitor C1.

In the constant current circuit 51 of this structure, sum of the emitter-base voltage of the transistor Q52 and the voltage across the resistor R52 equals the zener voltage of the zener diode ZD52. The constant current circuit 51 outputs a constant current of "Ig=(Vz−Vbe)/R", where "R" denotes the resistance value of the resistor R52, "Vbe" denotes the emitter-base voltage (i.e. about 0.7 [V]) of the transistor Q52, and "Vz" denotes the zener voltage of the zener diode ZD52.

Note that, the drive voltage Vg1 (Vg2) of the transistor 41 (42) of the bidirectional switch element 4 is applied on the p-n junction of the gate of the transistor 41 (42). Therefore, the drive voltage Vg1 (Vg2) has a negative temperature coefficient when the gate G1 (G2) is driven in a constant current. That is, the drive voltage Vg1 (Vg2) of the transistor 41 (42) of the bidirectional switch element 4 decreases with increase of the temperature under a condition that the drive current Ig1 (Ig2) is constant.

With regard to this, the constant current circuit 51 of the embodiment includes the transistor Q52 and the zener diode ZD52. A transistor has a temperature coefficient of its emitter-base voltage of about −2.0 [mV/° C.]. A zener diode having a zener voltage of about 5 [V] has a temperature coefficient of about 0 [mV/° C.]. In the constant current circuit 51 of the embodiment (shown in FIG. 23) therefore, the emitter-base voltage Vbe of the transistor Q52 decreases with increase of the temperature. Accordingly, "constant value" of the electric current outputted by the constant current circuit 51 increases with increase of the temperature. In other words, the constant current circuit 51 of the embodiment has a positive temperature coefficient. The constant current circuit 51 of the embodiment therefore can compensate the temperature coefficient of the drive voltage Vg1 (Vg2) of the transistor 41 (42).

The embodiment includes the constant current circuit 51 utilizing the transistor Q52 and the zener diode ZD52, and therefore can compensate the temperature coefficient of the bidirectional switch element 4 (transistors 41, 42) with a simple structure.

REFERENCE SIGNS LIST 1 control section
2 converter section
3 driver section
4 bidirectional switch element (semiconductor switch element)
31A, 31B turn-on circuit
32A, 32B turn-off circuit
C1A, C1B capacitor (first capacitor)
Q1 switching element (first switching element)

The invention claimed is:

1. A driver for semiconductor switch element comprising:
a converter section that comprises a first switching element and that is configured to output a desired direct-current voltage by switching the first switching element;
a control section configured to control a switching operation of the first switching element;
a first capacitor configured to be charged by an output of the converter section;
a turn-on circuit configured to supply a control terminal of the semiconductor switch element with a drive power by use of an electric charge stored in the first capacitor to turn-on the semiconductor switch element; and
a turn-off circuit configured to discharge the first capacitor to turn-off the semiconductor switch element in response to a halt to the switching operation of the first switching element by the control section.

2. The driver as set forth in claim 1, wherein the turn-on circuit comprises a constant current circuit configured to output a constant current.

3. The driver as set forth in claim 2, wherein
the turn-on circuit further comprises a noise-reduction circuit for reducing a noise in a turn-on period, and
the noise-reduction circuit is configured to increase an input impedance of the control terminal of the semiconductor switch element when the semiconductor switch element is turned-on.

4. The driver as set forth in claim 3, wherein the noise-reduction circuit is configured to change the input impedance of the control terminal of the semiconductor switch element in response to a change of a voltage applied on the control terminal.

5. The driver as set forth in claim 3, wherein the noise-reduction circuit is configured to decrease the input impedance of the control terminal at a predetermined time after starting a supply of the drive power to the control terminal of the semiconductor switch element.

6. The driver as set forth in claim 3, wherein
the semiconductor switch element comprises a pair of transistors each of which has a control terminal, the pair of transistors being connected in series to be conductive in both directions,
the noise-reduction circuit comprises a pair of noise-reduction circuits, and
each of the pair of noise-reduction circuits is connected to a control terminal of a corresponding transistor in the pair of transistors.

7. The driver as set forth in claim 2, wherein the constant current circuit has a positive temperature coefficient.

8. The driver as set forth in claim 7, wherein
the constant current circuit comprises a zener diode and a transistor, and
the positive temperature coefficient of the constant current circuit is constituted by a difference in temperature coefficients between the zener diode and the transistor.

9. The driver as set forth in claim 1, wherein the turn-on circuit comprises a current limiting circuit that limits an electric current supplied to the control terminal of the semiconductor switch element to less than a predetermined current.

10. The driver as set forth in claim 1, wherein
the first capacitor as a forward capacitor is connected in parallel with output terminals of the converter section,
the turn-on circuit includes a backward capacitor,
the forward capacitor is connected closer to the output terminals than the backward capacitor is,
the turn-on circuit comprises a switch section configured to be turned off when a voltage across the forward capacitor is less than a predetermined voltage and to be turned on when the voltage across the forward capacitor is the predetermined voltage or more, and
the backward capacitor is connected in parallel with the forward capacitor via the switch section.

11. The driver as set forth in claim 1, wherein the control section is configured to change a duty ratio of the first switching element during a turn-on period of the semiconductor switch element, thereby increasing a drive voltage applied on the control terminal of the semiconductor switch element after changing the duty ratio.

12. The driver as set forth in claim 1, wherein
the turn-off circuit comprises a second switching element connected in parallel with the first capacitor, and
the turn-off circuit is configured to turn on the second switching element to discharge the first capacitor thereby turning-off the semiconductor switch element, and then to turn off the second switching element upon a voltage across the first capacitor decreasing to a predetermined voltage.

13. The driver as set forth in claim 12, wherein
the second switching element is connected in series with a zener diode, and
the first capacitor is connected in parallel with a series circuit of the zener diode and the second switching element.

14. The driver as set forth in claim 1, wherein
the turn-off circuit comprises: a parallel circuit of a second capacitor and a resistor, connected between output terminals of the converter section; and a depletion-type third switching element configured to be driven by a voltage across the parallel circuit, and
the turn-off circuit is configured that a discharge current of the first capacitor increases with decrease of an on-resistance of the third switching element.

15. The driver as set forth in claim 14, wherein
the resistor is connected in series with a diode, and
the second capacitor is connected in parallel with a series circuit of the resistor and the diode.

16. The driver as set forth in claim 1, wherein the semiconductor switch element is formed of a wide-gap semiconductor.

17. The driver as set forth in claim 1, wherein
the semiconductor switch element comprises a pair of transistors each of which has a control terminal, the pair of transistors being connected in series to be conductive in both directions, and
the driver comprises a pair of driver sections, each of the pair of driver sections comprising the first capacitor, the turn-on circuit, and the turn-off circuits, to be adapted to a corresponding transistor in the pair of transistors.

* * * * *